United States Patent
Yen (10) Patent No.: US 9,837,701 B2
(45) Date of Patent: Dec. 5, 2017

(54) SEMICONDUCTOR PACKAGE INCLUDING ANTENNA SUBSTRATE AND MANUFACTURING METHOD THEREOF

(71) Applicant: Advanced Semiconductor Engineering, Inc., Kaohsiung (TW)

(72) Inventor: Han-Chee Yen, Taipei (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 31 days.

(21) Appl. No.: 13/783,840

(22) Filed: Mar. 4, 2013

(65) Prior Publication Data
US 2014/0247195 A1    Sep. 4, 2014

(51) Int. Cl.
*H01Q 1/22* (2006.01)
*H01L 23/31* (2006.01)
(Continued)

(52) U.S. Cl.
CPC ....... *H01Q 1/2283* (2013.01); *H01L 23/3128* (2013.01); *H01L 23/66* (2013.01);
(Continued)

(58) Field of Classification Search
CPC . H01L 2924/12042; H01L 2924/15787; H01L 25/16; H01L 2223/6677;
(Continued)

(56) References Cited

U.S. PATENT DOCUMENTS

| | | | |
|---|---|---|---|
| 4,040,060 A | * | 8/1977 | Kaloi ............. H01Q 9/0421 343/700 MS |
| 4,814,205 A | | 3/1989 | Arcilesi et al. |

(Continued)

FOREIGN PATENT DOCUMENTS

| | | |
|---|---|---|
| CN | 1627562 A | 6/2005 |
| CN | 1716695 A | 1/2006 |

(Continued)

OTHER PUBLICATIONS

Chun-Hsiang Huang, Chih-Ying Hsiao, Chuen-De Wang, Tonny Chen, Liao Kuo-Hsien, Tzong-Lin Wu, "Conformal Shielding Investigation for SiP Modules", 2010 IEEE Electrical Design of Advanced Package & Systems Symposium, Dec. 2010.

(Continued)

*Primary Examiner* — Graham Smith
*Assistant Examiner* — Noel Maldonado
(74) *Attorney, Agent, or Firm* — Foley & Lardner LLP; Cliff Z. Liu (57) ABSTRACT

A semiconductor package includes a package substrate, a semiconductor device, an antenna substrate and a package body. The semiconductor device is disposed on an upper surface of the package substrate. The antenna substrate is disposed on the semiconductor device and includes a core layer, a grounding layer formed on a lower surface of the core layer, and an antenna layer formed on an upper surface of the core layer and electrically connected to the grounding layer through a conductive via of the core layer. The package body encapsulates the semiconductor device and the antenna substrate.

20 Claims, 10 Drawing Sheets

(51) Int. Cl.
*H01L 23/00* (2006.01)
*H01Q 9/04* (2006.01)
*H01L 23/66* (2006.01)
*H01L 25/16* (2006.01)
*H01L 21/56* (2006.01)

(52) U.S. Cl.
CPC ............ *H01L 24/97* (2013.01); *H01L 25/16* (2013.01); *H01Q 9/0407* (2013.01); *H01L 21/561* (2013.01); *H01L 2223/6677* (2013.01); *H01L 2224/16145* (2013.01); *H01L 2224/16225* (2013.01); *H01L 2224/48091* (2013.01); *H01L 2224/48227* (2013.01); *H01L 2224/73257* (2013.01); *H01L 2924/12042* (2013.01); *H01L 2924/15787* (2013.01); *H01L 2924/181* (2013.01); *H01L 2924/19105* (2013.01); *H01L 2924/19107* (2013.01)

(58) Field of Classification Search
CPC ........... H01L 23/66; H01L 2924/19105; H01L 2224/73257; H01L 2224/16145; H01L 2224/48227; H01L 2924/19107; H01L 2224/48091; H01L 24/97; H01Q 9/0407; H01Q 1/2283
USPC .......................................... 343/700, 702, 713
See application file for complete search history.

(56) References Cited

U.S. PATENT DOCUMENTS

| | | | |
|---|---|---|---|
| 5,019,829 A * | 5/1991 | Heckman | H01Q 9/0407 174/557 |
| 5,166,772 A | 11/1992 | Soldner et al. | |
| 5,353,498 A | 10/1994 | Fillion et al. | |
| 5,355,016 A | 10/1994 | Swirbel et al. | |
| 5,557,142 A | 9/1996 | Gilmore et al. | |
| 5,639,989 A | 6/1997 | Higgins, III | |
| 5,677,511 A | 10/1997 | Taylor et al. | |
| 5,694,300 A | 12/1997 | Mattei et al. | |
| 5,776,798 A | 7/1998 | Quan et al. | |
| 5,886,876 A | 3/1999 | Yamaguchi | |
| 5,895,229 A | 4/1999 | Carney et al. | |
| 5,998,867 A | 12/1999 | Jensen et al. | |
| 6,093,972 A | 7/2000 | Carney et al. | |
| 6,150,193 A | 11/2000 | Glenn | |
| 6,225,694 B1 | 5/2001 | Terui | |
| 6,614,102 B1 | 9/2003 | Hoffman et al. | |
| 6,686,649 B1 | 2/2004 | Mathews et al. | |
| 6,740,959 B2 | 5/2004 | Alcoe et al. | |
| 6,757,181 B1 | 6/2004 | Villanueva | |
| 6,781,231 B2 | 8/2004 | Minervini | |
| 6,818,978 B1 | 11/2004 | Fan | |
| 6,865,084 B2 | 3/2005 | Lin et al. | |
| 6,881,896 B2 | 4/2005 | Ebihara | |
| 6,917,526 B2 | 7/2005 | Ajioka et al. | |
| 6,933,597 B1 | 8/2005 | Poddar et al. | |
| 6,962,869 B1 | 11/2005 | Bao et al. | |
| 6,998,532 B2 | 2/2006 | Kawamoto et al. | |
| 7,030,469 B2 | 4/2006 | Mahadevan et al. | |
| 7,042,398 B2 | 5/2006 | Tang et al. | |
| 7,045,385 B2 | 5/2006 | Kim et al. | |
| 7,049,682 B1 | 5/2006 | Mathews et al. | |
| 7,081,661 B2 | 7/2006 | Takehara et al. | |
| 7,109,410 B2 | 9/2006 | Arnold et al. | |
| 7,119,745 B2 * | 10/2006 | Gaucher et al. | 343/700 MS |
| 7,125,744 B2 | 10/2006 | Takehara et al. | |
| 7,129,422 B2 | 10/2006 | Arnold | |
| 7,161,252 B2 | 1/2007 | Tsuneoka et al. | |
| 7,180,012 B2 | 2/2007 | Tsuneoka et al. | |
| 7,187,060 B2 | 3/2007 | Usui | |
| 7,214,889 B2 | 5/2007 | Mazurkiewicz | |
| 7,327,015 B2 | 2/2008 | Yang et al. | |
| 7,342,303 B1 | 3/2008 | Berry et al. | |
| 7,444,734 B2 * | 11/2008 | Gaucher et al. | 29/600 |
| 7,451,539 B2 | 11/2008 | Morris et al. | |
| 7,478,474 B2 | 1/2009 | Koga | |
| 7,479,407 B2 | 1/2009 | Gehman et al. | |
| 7,488,903 B2 | 2/2009 | Kawagishi et al. | |
| 7,504,721 B2 | 3/2009 | Chen et al. | |
| 7,576,415 B2 | 8/2009 | Cha et al. | |
| 7,615,856 B2 | 11/2009 | Sakai et al. | |
| 7,629,674 B1 | 12/2009 | Foster | |
| 7,633,170 B2 | 12/2009 | Yang et al. | |
| 7,633,765 B1 | 12/2009 | Scanlan et al. | |
| 7,656,047 B2 | 2/2010 | Yang et al. | |
| 7,700,411 B2 | 4/2010 | Yang et al. | |
| 7,745,910 B1 | 6/2010 | Olson et al. | |
| 7,808,439 B2 | 10/2010 | Yang et al. | |
| 7,829,981 B2 | 11/2010 | Hsu | |
| 7,851,893 B2 | 12/2010 | Kim et al. | |
| 7,872,343 B1 | 1/2011 | Berry | |
| 7,944,038 B2 | 5/2011 | Chiu et al. | |
| 7,989,928 B2 | 8/2011 | Liao et al. | |
| 8,018,033 B2 | 9/2011 | Moriya | |
| 8,022,511 B2 | 9/2011 | Chiu et al. | |
| 8,030,750 B2 | 10/2011 | Kim et al. | |
| 8,058,714 B2 | 11/2011 | Noll et al. | |
| 8,061,012 B2 | 11/2011 | Carey et al. | |
| 8,110,902 B2 | 2/2012 | Eun et al. | |
| 8,186,048 B2 | 5/2012 | Leahy et al. | |
| 8,093,690 B2 | 6/2012 | Ko et al. | |
| 8,212,339 B2 | 7/2012 | Liao et al. | |
| 2004/0150097 A1 | 8/2004 | Gaynes et al. | |
| 2005/0029673 A1 | 2/2005 | Naka et al. | |
| 2005/0039946 A1 | 2/2005 | Nakao | |
| 2005/0122265 A1 * | 6/2005 | Gaucher et al. | 343/700 MS |
| 2005/0161837 A1 * | 7/2005 | Matsui | 257/797 |
| 2007/0029667 A1 * | 2/2007 | Fujii et al. | 257/723 |
| 2007/0063056 A1 * | 3/2007 | Gaucher | H01L 23/4334 235/492 |
| 2008/0174013 A1 | 7/2008 | Yang et al. | |
| 2009/0000114 A1 | 1/2009 | Rao et al. | |
| 2009/0000815 A1 | 1/2009 | Hiner et al. | |
| 2009/0000816 A1 | 1/2009 | Hiner et al. | |
| 2009/0002969 A1 | 1/2009 | Madsen et al. | |
| 2009/0002971 A1 | 1/2009 | Carey et al. | |
| 2009/0025211 A1 | 1/2009 | Hiner et al. | |
| 2009/0035895 A1 | 2/2009 | Lee et al. | |
| 2009/0102003 A1 | 4/2009 | Vogt et al. | |
| 2009/0102033 A1 | 4/2009 | Raben | |
| 2009/0194851 A1 | 8/2009 | Chiu et al. | |
| 2009/0194852 A1 | 8/2009 | Chiu et al. | |
| 2009/0230487 A1 | 9/2009 | Saitoh et al. | |
| 2009/0256244 A1 | 10/2009 | Liao et al. | |
| 2010/0032815 A1 | 2/2010 | An et al. | |
| 2010/0110656 A1 | 5/2010 | Ko et al. | |
| 2010/0199492 A1 | 8/2010 | Hiner et al. | |
| 2010/0207257 A1 | 8/2010 | Lee | |
| 2011/0115060 A1 | 5/2011 | Chiu et al. | |
| 2011/0127654 A1 | 6/2011 | Weng et al. | |
| 2012/0062439 A1 | 3/2012 | Liao et al. | |
| 2012/0280366 A1 * | 11/2012 | Kamgaing et al. | 257/621 |

FOREIGN PATENT DOCUMENTS

| | | |
|---|---|---|
| CN | 102324416 A | 1/2012 |
| JP | 08-288686 | 11/1996 |
| WO | WO-2004/060034 A1 | 7/2004 |

OTHER PUBLICATIONS

Office Action for Chinese Patent Application No. 201410059783.0 dated May 30, 2016.

* cited by examiner

SEMICONDUCTOR PACKAGE INCLUDING ANTENNA SUBSTRATE AND MANUFACTURING METHOD THEREOF

BACKGROUND OF THE INVENTION

Field of the Invention

The invention relates in general to a semiconductor package and a manufacturing method thereof, and more particularly to a semiconductor package with an antenna substrate and a manufacturing method thereof.

Description of the Related Art

Wireless communication devices, such as cell phones, typically include antennas for transmitting and receiving radio frequency (RF) signals. Conventionally, a wireless communication device includes an antenna layer and a communication module, wherein the antenna layer and the communication module are integrated together into a chip. However, when one portion of the chip, either the antenna portion or the communication module portion, is determined to be defective, the whole chip has to be discarded even if the other portion is working properly.

SUMMARY OF THE INVENTION

According to one aspect of this disclosure, a semiconductor package is provided. According to one embodiment, the semiconductor package includes a package substrate, a semiconductor device, an antenna substrate and a package body. The semiconductor device is disposed adjacent to an upper surface of the package substrate. The antenna substrate is disposed on the semiconductor device and includes a core layer, a grounding layer formed on a lower surface of the core layer, and an antenna layer formed on an upper surface of the core layer. The antenna layer is electrically connected to the grounding layer through a conductive via of the core layer. The package body is disposed adjacent to the upper surface of the substrate and encapsulates the semiconductor device and the antenna substrate.

According to another embodiment, the semiconductor package includes a package substrate, a chip, an antenna substrate, a spacer substrate and a package body. The chip is disposed adjacent to an upper surface of the package substrate and is electrically connected to the package substrate through a wire. The spacer substrate is disposed on the chip. The antenna substrate is disposed on the spacer substrate, and includes a core layer, a grounding layer formed on a lower surface of the core layer, and an antenna layer formed on an upper surface of the core layer. The antenna layer is electrically connected to the grounding layer through a conductive via of the core layer. The package body encapsulates the chip, the spacer substrate and the antenna substrate.

According to another aspect of this disclosure, a manufacturing method of forming a semiconductor package is provided. In one embodiment, a package substrate is provided, wherein the package substrate includes an upper surface. A chip is provided, and the chip is disposed on the upper surface of the package substrate. An antenna substrate verified to be a working antenna substrate is provided, wherein the antenna substrate includes a core layer, a grounding layer formed on a lower surface of the core layer and an antenna layer formed on an upper surface of the core layer and electrically connected to the grounding layer through a conductive via of the core layer. The antenna substrate is disposed on the chip. A package body is formed, wherein the package body encapsulates a portion of the upper surface of the substrate, the chip and the antenna substrate.

BRIEF DESCRIPTION OF THE DRAWINGS

Common reference numerals are used throughout the drawings and the detailed description to indicate similar elements. Embodiments of this disclosure will be more apparent from the following detailed description taken in conjunction with the accompanying drawings.

DETAILED DESCRIPTION OF THE INVENTION

It is desirable to have the benefits of an integrated semiconductor package including an antenna portion and a communication module portion of a wireless communication device without having reduced yield resulting from their integration. Embodiments disclosed herein provide such an integrated semiconductor package.

Figure 1A:
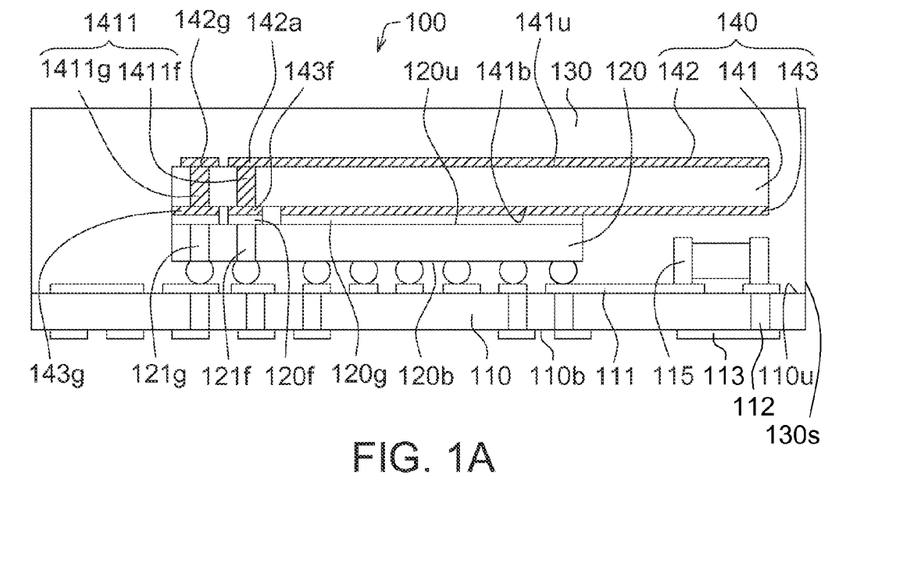
FIG. 1A and FIG. 1C illustrate a cross-sectional view of an example semiconductor package according to one embodiment.

Referring to FIG. 1A, a cross-sectional view of a semiconductor package according to one embodiment is illustrated. The semiconductor package 100 includes a package substrate 110, a passive component 115, a chip 120, a package body 130 and an antenna substrate 140.

The package substrate 110 has an upper surface 110$u$, a lower surface 110$b$ opposite the upper surface 110$u$, a trace 111, a conductive via 112 and a plurality of pads 113. The trace 111 is formed on the upper surface 110$u$, the conductive via 112 is extended to the lower surface 110$b$ from the upper surface 110$u$, and the pads 113 are formed on the lower surface 110$b$. The passive component 115 and the chip 120 may be electrically connected to the pads 113 through the conductive via 112. In addition, the package substrate 110 can be a multi-layered organic substrate or a ceramic substrate, for example.

The passive component 115 is disposed on the upper surface 110$u$ of the package substrate 110 and electrically connected to the chip 120 through the trace 111. The passive component 115 may be, for example, a resistor, an inductor or a capacitor.

The chip 120 is disposed on the upper surface 110$u$ of the package substrate 110. The chip 120 is coupled to the upper surface 110$u$ of the package substrate 110 in a "face-down" orientation and electrically connected to the package substrate 110 via a plurality of solder balls. This configuration is sometimes referred to as "flip-chip". The chip 120 may be an active chip or SOC (system on chip). For example, the chip 120 may be a transceiver for transmitting radio frequency (RF) signals to the antenna substrate 140 and receiving RF signals from the antenna substrate 140.

The chip 120 includes an upper surface 120u and a feeding conductive via 121f. The chip 120 is part of a semiconductor device including a feeding layer 120f formed on the upper surface 120u of the chip 120. The feeding layer 120f is electrically connected to the package substrate 110 through the feeding conductive via 121f. The semiconductor device further includes a grounding layer 120g formed on the upper surface 120u of the chip 120. The chip 120 includes a grounding conductive via 121g electrically connecting the grounding layer 120g and the package substrate 110. That is, the grounding layer 120g formed on the upper surface 120u of the chip 120 may be electrically connected to a ground potential through the grounding conductive via 121g. The grounding conductive via 121g and the feeding conductive via 121f may be implemented as through-silicon vias (TSV), for example.

The package body 130 encapsulates a portion of the upper surface 110u of the package substrate 110, the chip 120, and the antenna substrate 140. The package body 130 may include material such as novolac-based resin, epoxy-based resin, silicone-based resin or other suitable encapsulant. The package body 130 may also include suitable fillers such as powdered silicon dioxide. The package body 130 can be formed by various packaging technologies, such as, for example, compression molding, injection molding or transfer molding.

The antenna substrate 140 is disposed on the semiconductor device. In the illustrated embodiment, the antenna substrate 140 is directly disposed on the semiconductor device without an intervening layer, thereby reducing a signal transmission path and controlling electromagnetic interference (EMI). It is also contemplated that similar benefits can be attained by controlling a spacing between the antenna substrate 140 and the semiconductor device, such as to within about 500 μm, within about 400 μm, within about 300 μm, within about 200 μm, within about 100 μm, or with about 50 μm.

The antenna substrate 140 includes a core layer 141, an antenna layer 142 and a grounding layer 143. The core layer 141 includes an upper surface 141u, a lower surface 141b opposite the upper surface 141u, and at least one conductive via 1411. As illustrated in the embodiment of FIG. 1A, the at least one conductive via 1411 includes at least a feeding conductive via 1411f and a grounding conductive via 1411g. The core layer 141 may be a silicon substrate, an organic substrate, and a ceramic substrate, for example. The antenna layer 142 and the grounding layer 143 are respectively formed on the upper surface 141u and lower surface 141b of the core layer 141.

The grounding layer 143 includes a feeding portion 143f and a grounding portion 143g spaced and electrically isolated from the feeding portion 143f. The feeding portion 143f directly contacts the feeding layer 120f, and the feeding portion 143f is electrically connected to the feeding conductive via 121f. The grounding portion 143g directly contacts the grounding layer 120g, and the grounding portion 143g is electrically connected to the ground potential through the grounding conductive via 121g.

The grounding layer 143 can serve as a shielding layer to protect electronic components below the grounding layer 143 from EMI caused by the antenna layer 142, since the grounding portion 143g of the grounding layer 143 is electrically connected to the ground potential. For example, in the embodiment of FIG. 1A, the grounding layer 143 of the antenna substrate 140 extends over the chip 120 and over the passive component 115 to protect the chip 120 and the passive component 115 from EMI. In another embodiment, the antenna substrate 140 may extend to a lateral surface of the package body 130, such as to lateral surface 130s, to overlap the whole upper surface 110u of the package substrate 110.

The antenna layer 142 is a patterned metal layer formed on the upper surface 141u of the core layer 141. The antenna layer 142 includes a grounding portion 142g and an antenna portion 142a spaced and electrically isolated from the grounding portion 142g. The antenna portion 142a is electrically connected to the feeding portion 143f of the grounding layer 143 through the feeding conductive via 1411f, and the grounding portion 142g is electrically connected to the grounding portion 143g of the grounding layer 143 through the grounding conductive via 1411g.

The antenna substrate 140 converts electric power into radio waves, and vice versa. In transmission, the chip 120 functioning as a radio transmitter supplies an oscillating radio frequency electric current to the antenna layer 142 through the feeding conductive via 121f, the feeding layer 120f, the feeding portion 143f, and the feeding conductive via 1411f, and the antenna layer 142 radiates the energy from the current as electromagnetic waves. In reception, the antenna layer 142 intercepts the power of electromagnetic waves to produce a voltage applied to the chip 120 functioning as a radio receiver, through the feeding conductive via 1411f, the feeding portion 143f, the feeding layer 120f and the feeding conductive via 121f. The RF signal path is reduced by directly coupling the feeding conductive via 1411f of the antenna substrate 140 to the feeding conductive via 121f of the chip 120, and the RF signal attenuation is accordingly reduced.

As illustrated in FIG. 1A, the antenna layer 142 is encapsulated by the package body 130. However, in another embodiment, the antenna layer 142 may be exposed from the package body 130, as shown in FIG. 1C and FIG. 3B for another embodiment. In addition, the antenna substrate 140, which passes the quality test and is a known good antenna substrate (i.e., a working antenna substrate), is disposed on the chip 120 to form the semiconductor package 100. As a result, a defective antenna substrate can be found before being disposed on the chip 120, thus yield is improved and cost is reduced.

Figure 1B:
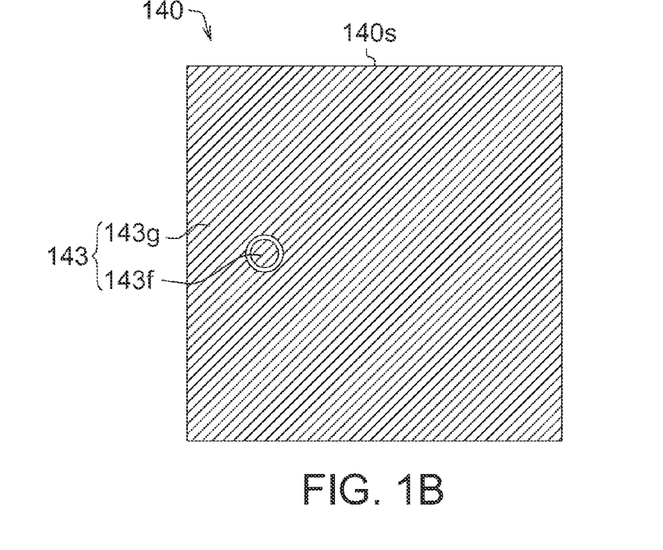
FIG. 1B illustrates a bottom view of an example antenna substrate.
Figure 1C:
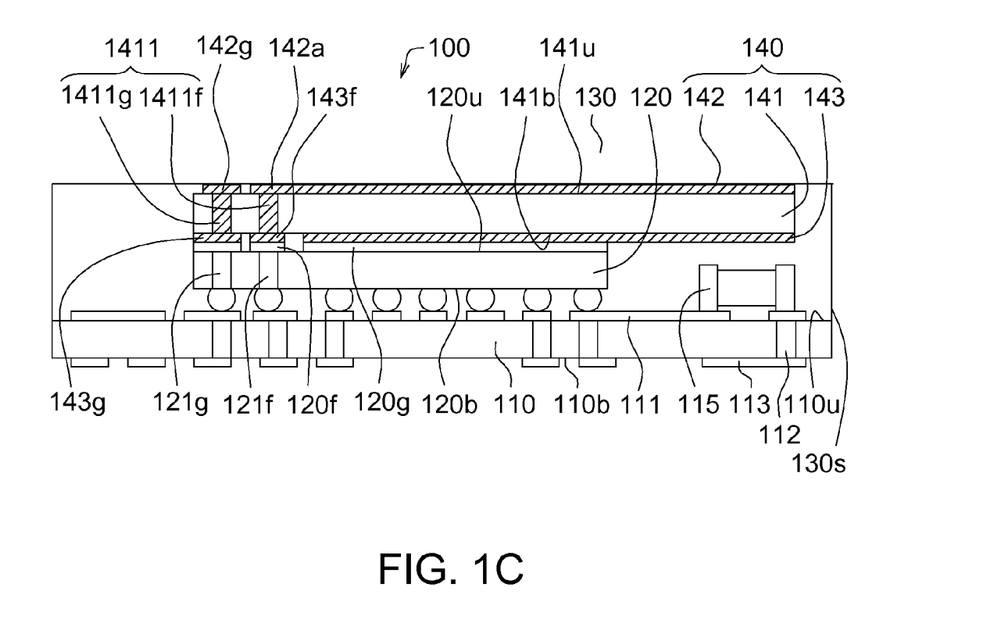

Referring to FIG. 1B, a bottom view of the antenna substrate 140 of FIG. 1A is illustrated. The grounding portion 143g, which is spaced and electrically isolated from the feeding portion 143f, surrounds the feeding portion 143f. Moreover, the grounding portion 143g is extended to a lateral surface 140s of the antenna substrate 140 to obtain the broadest shielding area.

Figure 2A:
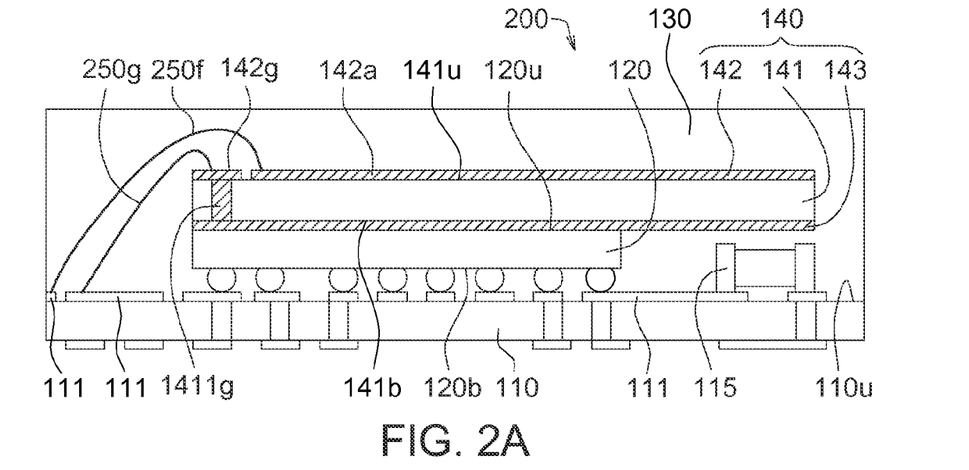
FIG. 2A illustrates a cross-sectional view of an example semiconductor package according to another embodiment.

Referring to FIG. 2A, a cross-sectional view of a semiconductor package 200 according to another embodiment is illustrated. The semiconductor package 200 includes the package substrate 110, the passive component 115, the chip 120, the package body 130, the antenna substrate 140, a grounding wire 250g and a feeding wire 250f.

The chip 120 is disposed on the upper surface 110u of the package substrate 110. The chip 120 includes the upper surface 120u, and an active surface 120b opposite to the upper surface 120u. The upper surface 120u facing toward the antenna substrate 140 is an inactive surface. The active surface 120b faces toward the package substrate 110 and is electrically connected to the package substrate 110 via a plurality of solder balls.

The package body 130 encapsulates the chip 120, the antenna substrate 140 and the grounding wire 250g and the feeding wire 250f.

The antenna substrate 140 is directly disposed on the chip 120 and includes the core layer 141, the antenna layer 142 and the grounding layer 143. The core layer 141 includes the upper surface 141u, the lower surface 141b opposite to the upper surface 141u and the grounding conductive via 1411g. The antenna layer 142 is formed on the upper surface 141u of the core layer 141, and the grounding layer 143 is formed on the lower surface 141b of the core layer 141 and directly contacts the upper surface 120u of the chip 120.

The antenna layer 142 of the antenna substrate 140 includes the grounding portion 142g and the antenna portion 142a, wherein the grounding portion 142g is electrically connected to the package substrate 110 through the grounding wire 250g, and the antenna portion 142a is electrically connected to the package substrate 110 through the feeding wire 250f. The grounding layer 143 is electrically connected to the grounding portion 142g of the antenna layer 142 through the grounding conductive via 1411g. Accordingly, the grounding layer 143 is electrically connected to the ground potential through the grounding conductive via 1411 g, the grounding portion 142g and the grounding wire 250g. Through a trace 111 of the package substrate 110 and the feeding wire 250f, an RF signal is transmitted from the antenna substrate 140 to the chip 120.

Figure 2B:
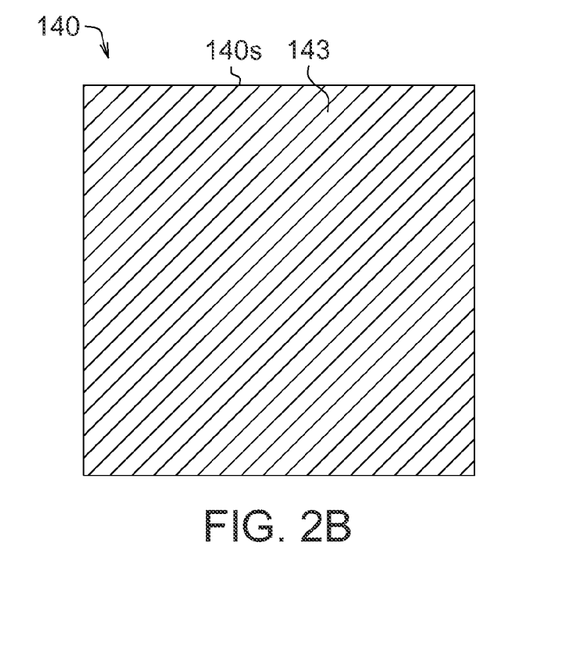
FIG. 2B illustrates a bottom view of another example antenna substrate.

Referring to FIG. 2B, a bottom view of the antenna substrate of FIG. 2A is illustrated. The grounding layer 143 covers the entire lower surface 141b (illustrated in FIG. 2A) of the core layer 141, that is, the grounding layer 143 is a continuous metal layer without any hollow pattern. The bottom view shown is intended to be an example and not limiting. In another embodiment, the grounding layer 143 can be a patterned grounding layer, or can cover at least about 70%, at least about 80%, at least about 90%, or at least about 95% of the lower surface 141b. In addition, the grounding layer 143 may be extended to at least one of the lateral surfaces 140s of the antenna substrate 140 to obtain the broadest shielding area.

Figure 3A:
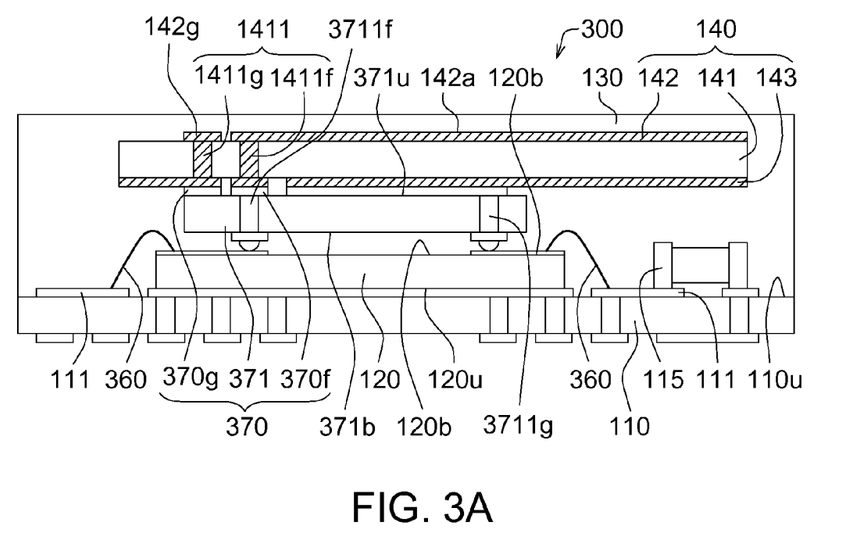
FIG. 3A and FIG. 3B illustrate a cross-sectional view of an example semiconductor package according to another embodiment.
Figure 3B:
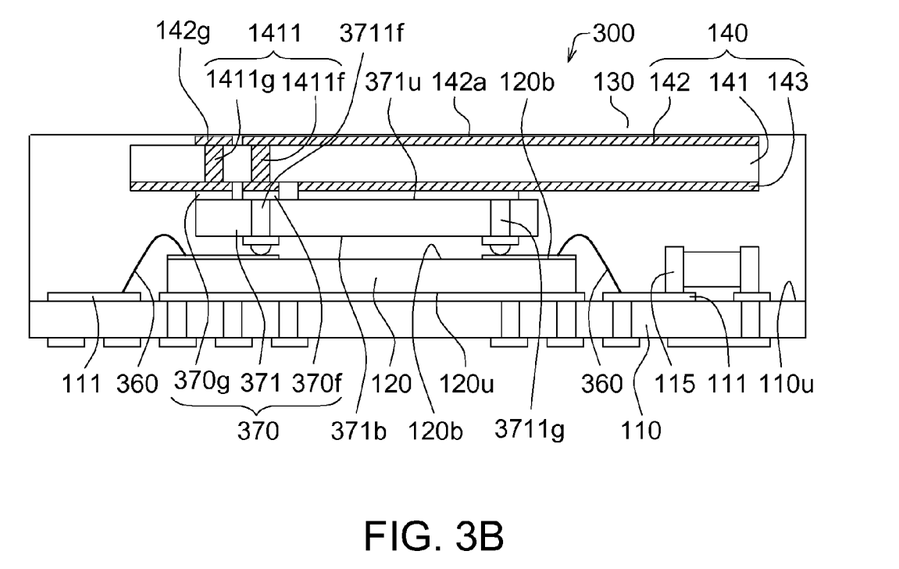

Referring to FIG. 3A, a cross-sectional view of a semiconductor package 300 according to another embodiment is illustrated. The semiconductor package 300 includes the package substrate 110, the passive component 115, the chip 120, the package body 130, the antenna substrate 140, at least one conductive bond wire 360 and a spacer substrate 370.

The chip 120 may be coupled to the package substrate 110 in a "face-up" orientation, and electrically connected to the package substrate 110 via a plurality of conductive bond wires 360. The chip 120 includes the lower surface 120u facing toward the package substrate 110 and the active surface 120b facing toward the spacer substrate 370.

The antenna substrate 140 includes the core layer 141, the antenna layer 142 and the grounding layer 143. In the present embodiment, the structure of the grounding layer 143 is similar to that illustrated in FIG. 1, and the similarities are not repeated here.

The spacer substrate 370 is an interposer substrate disposed between the chip 120 and the antenna substrate 140 to provide a space to accommodate the conductive bond wires 360, thus avoiding electrical connection of the conductive bond wires 360 to the grounding layer 143 of the antenna substrate 140. In the illustrated embodiment, the antenna substrate 140 is directly disposed on the spacer substrate 370, and the spacer substrate 370 is directly disposed on the chip 120, thereby reducing a signal transmission path and controlling EMI. It is also contemplated that similar benefits can be obtained by controlling a spacing between the antenna substrate 140 and the spacer substrate 370 or a spacing between the spacer substrate 370 and the chip 120, such as to within about 500 μm, within about 400 μm, within about 300 μm, within about 200 μm, within about 100 μm, or with about 50 μm.

The spacer substrate 370 is directly coupled to the chip 120 in a "face-down" orientation and electrically connected to the chip 120 via a plurality of solder balls. The spacer substrate 370 includes a base 371, a feeding layer 370f and a grounding layer 370g. The base 371 includes an upper surface 371u and a lower surface 371b, and the feeding layer 370f and the grounding layer 370g are formed on the upper surface 371u. The base 371 further includes a feeding conductive via 3711f and a grounding conductive via 3711g, wherein the feeding conductive via 3711f electrically connects the feeding layer 370f and the chip 120, and the grounding conductive via 3711g electrically connects the grounding layer 370g and the chip 120.

Figure 4:
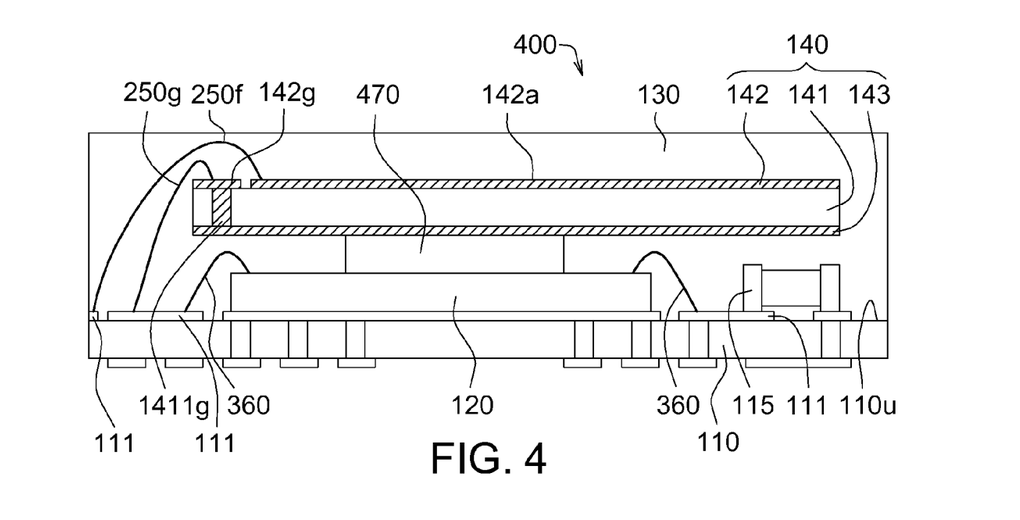
FIG. 4 illustrates a cross-sectional view of an example semiconductor package according to another embodiment.

Referring to FIG. 4, a cross-sectional view of a semiconductor package 400 according to another embodiment is illustrated. The semiconductor package 400 includes the package substrate 110, the passive component 115, the chip 120, the package body 130, the antenna substrate 140, the feeding wire 250f, the grounding wire 250g, at least one conductive bond wire 360 and a spacer substrate 470.

The antenna substrate 140 includes the core layer 141, the antenna layer 142 and the grounding layer 143. In the present embodiment, the structure of the antenna substrate 140 is similar to that illustrated in FIG. 2, and the similarities are not repeated here.

The feeding wire 250f can be electrically connected to the chip 120 and the trace 111 of the package substrate 110, such that an RF signal is transmitted from the antenna substrate 140 to the chip 120 through the trace 111 of the package substrate 110 and the feeding wire 250f. The grounding portion 142g can be electrically connected to the ground potential through the grounding wire 250g and the trace 111 of the package substrate 110. Since the antenna substrate 140 can be electrically connected to the package substrate 110 through the grounding wire 250g and the feeding wire 250f, conductive elements such as vias or traces may be omitted in the spacer substrate 470.

The spacer substrate 470 is an insulation substrate, which is formed of a material including silicon or glass, for example. The spacer substrate 470 is directly disposed on the chip 120 and has an upper surface 470u. The antenna substrate 140 is directly disposed on the upper surface 470u of the spacer substrate 470.

Referring to FIGS. 5A-5E, manufacturing processes according to the semiconductor package of FIG. 1A are illustrated.

Figure 5A:
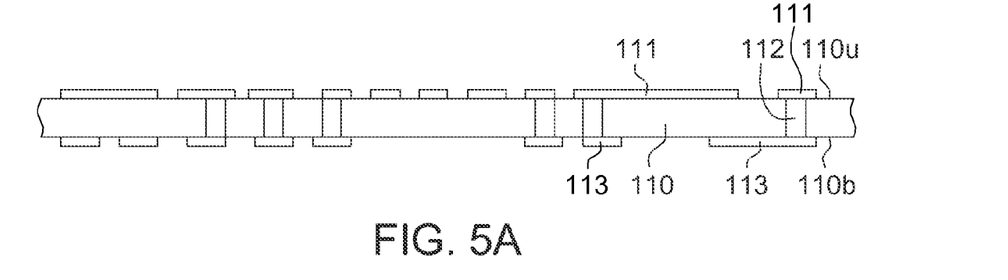
FIGS. 5A-5E illustrate an example manufacturing process.

Referring to FIG. 5A, the package substrate 110 is provided, wherein the package substrate 110 includes the upper surface 110u, the lower surface 110b, a plurality of the traces 111, a plurality of the conductive vias 112 and a plurality of the pads 113. The traces 111 are formed on the upper surface 110u, the conductive vias 112 extend to the lower surface 110b from the upper surface 110u, and the pads 113 are formed on the lower surface 110b. The pads 113 are electrically connected to the traces 111 through the conductive vias 112.

Figure 5B:
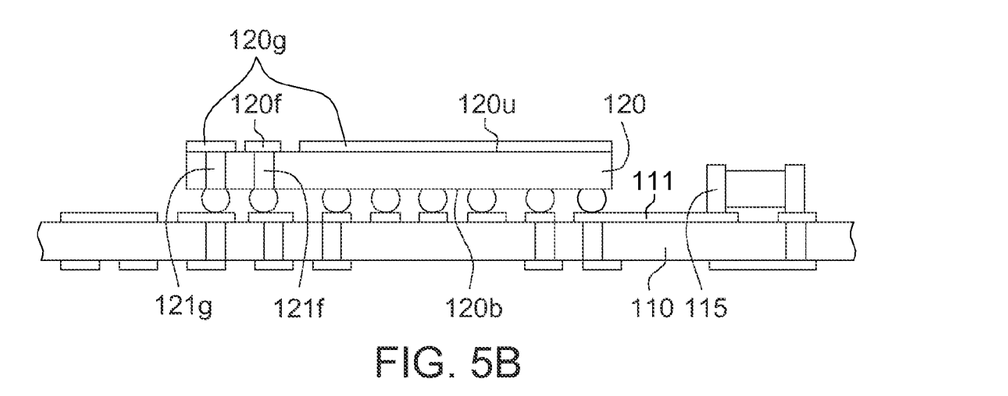

Referring to FIG. 5B, the passive component 115 and the chip 120 are disposed on the upper surface 110u of the package substrate 110. The chip 120 is coupled to the upper surface 110u of the package substrate 110 in a "face-down"

orientation and electrically connected to the package substrate 110 via a plurality of solder balls. The chip 120 includes the upper surface 120u, and is part of a semiconductor device that includes the feeding layer 120f and the feeding conductive via 121f, wherein the feeding layer 120f is formed on the upper surface 120u of the chip 120, and the feeding conductive via 121f electrically connects the feeding layer 120f and the package substrate 110.

Figure 5C:
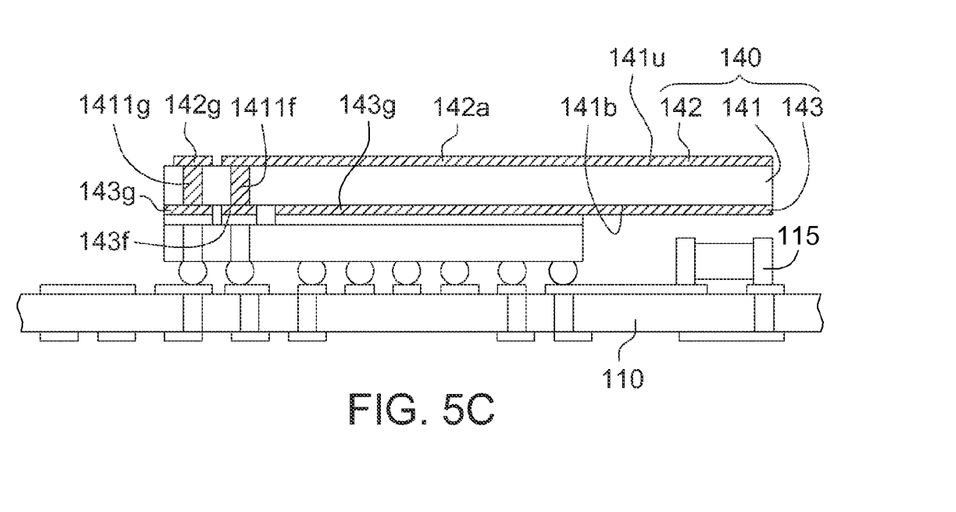

Referring to FIG. 5C, the antenna substrate 140 is disposed on the chip 120 using, for example, surface mount technology (SMT). The antenna substrate 140, which passes the quality test and is a known good antenna substrate (i.e., a working substrate), is disposed on the chip 120. As a result, yield is improved and cost is reduced. In the illustration, the antenna substrate 140 extends horizontally to overlap the passive component 115.

The antenna substrate 140 includes the core layer 141, the antenna layer 142 and the grounding layer 143. The core layer 141 includes the upper surface 141u, the lower surface 141b, the grounding conductive via 1411g and the feeding conductive via 1411f. The antenna layer 142 is formed on the upper surface 141u of the core layer 141, and the grounding layer 143 is formed on the lower surface 141b of the core layer 141. The antenna layer 142 includes the antenna portion 142a and the grounding portion 142g spaced and electrically isolated from the antenna portion 142a, and the grounding layer 143 includes the grounding portion 143g and the feeding portion 143f spaced and electrically isolated from the grounding portion 143g. The antenna portion 142a is electrically connected to the feeding portion 143f through the feeding conductive via 1411f, and the grounding portion 142g is electrically connected to the grounding portion 143g through grounding conductive via 1411g.

Figure 5D:
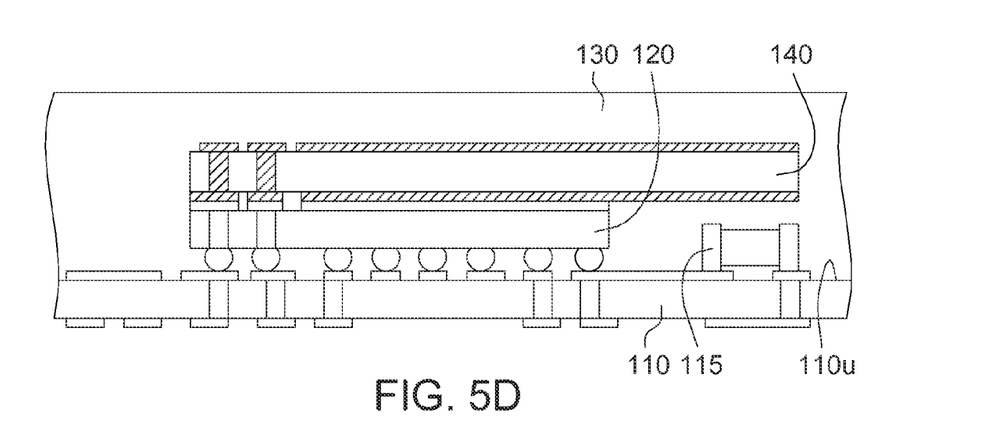

Referring to FIG. 5D, the package body 130 is formed on the upper surface 110u of the package substrate 110, encapsulating the passive element 115, the chip 120 and the antenna substrate 140.

Figure 5E:
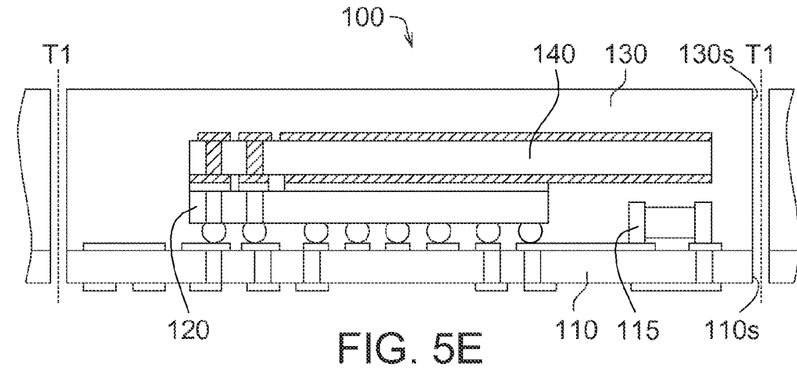

Referring to FIG. 5E, a number of singulation paths T1 are formed passing through the package body 130 and the package substrate 110 to form the semiconductor package 100. The singulation paths T1 are formed using a laser or another cutting tool. The lateral surfaces 130s of the package body 130 and the lateral surface 110s of the package substrate 110 are formed by the singulation. The lateral surface 130s is flush with the lateral surface 110s. In the present embodiment, the singulation method is a "full-cut method", that is, the singulation paths T1 cut fully through the package substrate 110 and the package body 130. In another embodiment, the package body 130 and the package substrate 110 can be singulated using a "half-cut method", that is, the singulation paths T1 cut through a portion of the package substrate 110 or a portion of the package body 130.

The method of forming the semiconductor package 200 is similar to that of forming the semiconductor package 100 of FIG. 1A, and the similarities are not repeated here.

Referring to FIGS. 6A-6E, manufacturing processes according to the semiconductor package of FIG. 3 are illustrated.

Figure 6A:
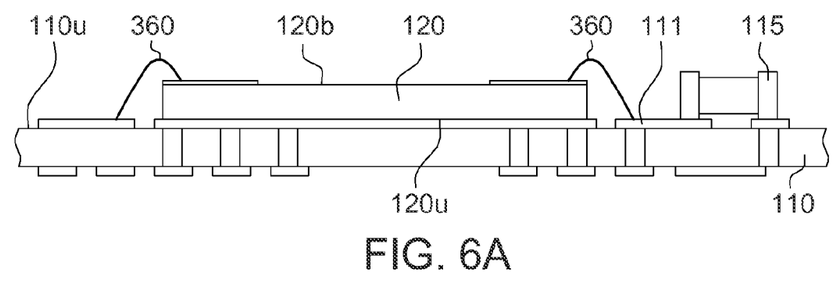
FIGS. 6A-6E illustrate an example manufacturing process.

Referring to FIG. 6A, the passive component 115 and the chip 120 are disposed on the upper surface 110u of the package substrate 110. The chip 120 is coupled to the upper surface 110u of the package substrate 110 in a "face-up" orientation and electrically connected to the package substrate 110 via a plurality of conductive bond wires 360.

Figure 6B:
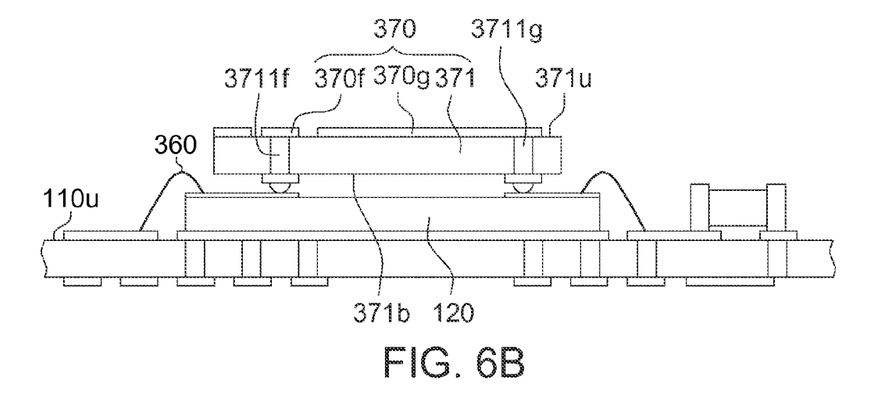

Referring to FIG. 6B, the spacer substrate 370 is disposed on the chip 120. The spacer substrate 370 is directly coupled to the chip 120 in a "face-down" orientation and electrically connected to the chip 120 via a plurality of solder balls. The spacer substrate 370 includes the base 371, the feeding layer 370f and the grounding layer 370g. The base 371 includes the upper surface 371u and the lower surface 371b, wherein the feeding layer 370f and the grounding layer 370g are formed on the upper surface 371u. The base 371 further includes a feeding conductive via 3711f and the grounding conductive via 3711g, wherein the feeding conductive via 3711f electrically connects the feeding layer 370f and the chip 120, and the grounding conductive via 3711g electrically connects the grounding layer 370g and the chip 120.

Figure 6C:
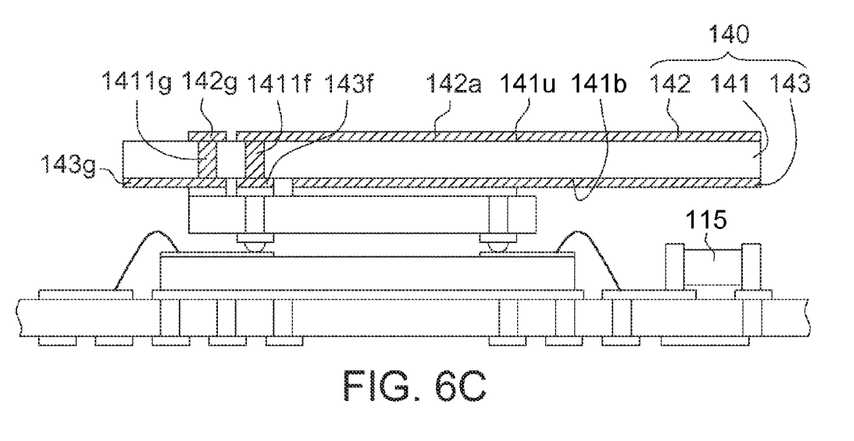

Referring to FIG. 6C, the antenna substrate 140 is disposed on the spacer substrate 370 using, for example, SMT. The antenna substrate 140, which passes the quality test and is a known good antenna substrate (i.e., a working antenna substrate), is disposed on the spacer substrate 370. In the illustration, the antenna substrate 140 extends horizontally to overlap the passive component 115.

The antenna substrate 140 includes the core layer 141, the antenna layer 142 and the grounding layer 143, wherein the core layer 141 includes the upper surface 141u, the lower surface 141b, the grounding conductive via 1411g and the feeding conductive via 1411f. The antenna layer 142 is formed on the upper surface 141u of the core layer 141, and the grounding layer 143 is formed on the lower surface 141b of the core layer 141. The antenna layer 142 includes the antenna portion 142a and the grounding portion 142g spaced and electrically isolated from the antenna portion 142a. The grounding layer 143 includes the grounding portion 143g and the feeding portion 143f spaced and electrically isolated from the grounding portion 143g. The grounding portion 143g is electrically connected to the grounding portion 142g through the grounding conductive via 1411g, and the feeding portion 143f is electrically connected to the antenna portion 142a through the feeding conductive via 1411f.

Figure 6D:
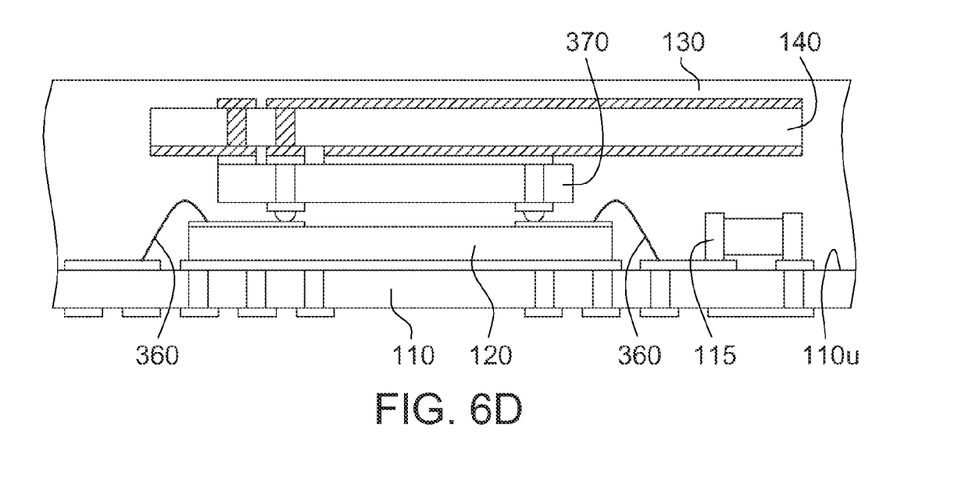

Referring to FIG. 6D, the package body 130 is formed on the upper surface 110u of the package substrate 110, encapsulating the passive component 115, the chip 120, the antenna substrate 140 and the conductive bond wires 360.

Figure 6E:
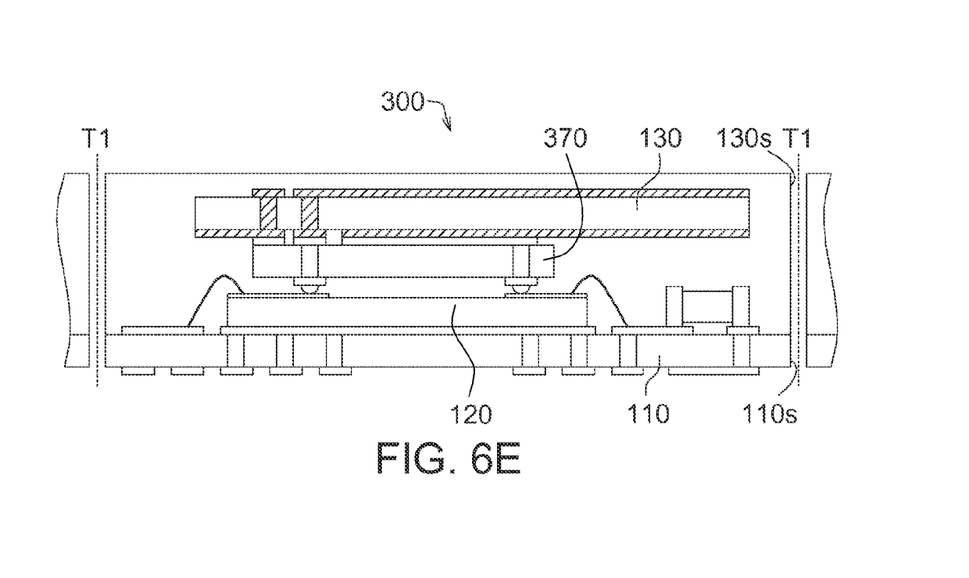

Referring to FIG. 6E, a number of singulation paths T1 passing through the package body 130 and the package substrate 110 are formed to form the semiconductor package 300. The singulation paths T1 are formed using a laser or another cutting tool. The lateral surface 130s of the package body 130 and the lateral surface 110s of the package substrate 110 are formed, such that the lateral surface 130s is flush with the lateral surface 110s. In the present embodiment, the singulation method is a "full-cut method", that is, the singulation paths T1 cut fully through the package substrate 110 and the package body 130.

The method of forming the semiconductor package 400 is similar to that of forming the semiconductor package 400 of FIG. 4, and the similarities are not repeated here.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package comprising:
a package substrate including an upper surface;
a semiconductor device disposed adjacent to the upper surface of the package substrate;
an antenna substrate directly disposed on the semiconductor device without an intervening layer, the antenna substrate covering the semiconductor device, the antenna substrate including:
a core layer including an upper surface, a lower surface, a lateral surface extending between the upper surface and the lower surface of the core layer, a feeding conductive via and a grounding conductive via;
a grounding layer formed on the lower surface of the core layer; and
an antenna layer formed on the upper surface of the core layer and electrically connected to the grounding layer through the grounding conductive via; and
a package body encapsulating and in contact with the semiconductor device and the entire lateral surface of the core layer of the antenna substrate.

2. The semiconductor package of claim 1, wherein the grounding layer includes a feeding portion and a grounding portion, and the grounding portion is spaced from and surrounds the feeding portion.

3. The semiconductor package of claim 1, wherein the grounding layer covers the entire lower surface of the core layer.

4. The semiconductor package of claim 1, wherein the semiconductor device includes
a chip including an upper surface and a feeding conductive via; and
a feeding layer formed on the upper surface of the chip;
wherein the antenna substrate is electrically connected to the package substrate through the feeding conductive via of the antenna substrate, the feeding layer and the feeding conductive via of the chip.

5. The semiconductor package of claim 1,
wherein the semiconductor device includes a chip with an upper surface and a grounding conductive via, and further includes a grounding layer formed on the upper surface of the chip, and
wherein the antenna substrate is electrically connected to the package substrate through the grounding layer and the grounding conductive via of the chip.

6. The semiconductor package of claim 1, wherein the antenna layer of the antenna substrate is exposed from the package body.

7. The semiconductor package of claim 1, wherein the antenna layer of the antenna substrate includes a grounding portion and an antenna portion, and the semiconductor package further comprises:
a feeding wire connecting the antenna portion and the package substrate; and
a grounding wire connecting the grounding portion and the package substrate.

8. The semiconductor package of claim 1, further comprising:
a passive component disposed on the package substrate;
wherein the antenna substrate at least partially extends over the passive component.

9. A semiconductor package comprising:
a package substrate including an upper surface;
a chip disposed adjacent to the upper surface of the package substrate;
a wire electrically connecting the chip and the package substrate;
a spacer substrate directly disposed on the chip;
an antenna substrate directly disposed on the spacer substrate and extending over the chip to cover the chip and comprising:
a core layer including an upper surface, a lower surface, a lateral surface extending between the upper surface and the lower surface of the core layer, and a conductive via;
a grounding layer formed on the lower surface of the core layer; and
an antenna layer formed on the upper surface of the core layer and electrically connected to the grounding layer through the conductive via; and
a package body encapsulating and in contact with the chip, the spacer substrate, and the entire lateral surface of the core layer of the antenna substrate.

10. The semiconductor package of claim 9, wherein the grounding layer includes a feeding portion and a grounding portion, and the grounding portion is spaced from and surrounds the feeding portion.

11. The semiconductor package of claim 9, wherein the grounding layer covers the entire lower surface of the core layer.

12. The semiconductor package of claim 9, wherein the spacer substrate is an interposer substrate disposed between the chip and the antenna substrate and includes a conductive via electrically connected to the antenna substrate and the chip.

13. The semiconductor package of claim 12, wherein the interposer substrate includes an upper surface, a feeding layer formed at the upper surface of the interposer substrate and a feeding conductive via, and the antenna substrate is electrically connected to the chip through the feeding layer and the feeding conductive via.

14. The semiconductor package of claim 12, wherein the interposer substrate includes an upper surface, a grounding layer formed at the upper surface of the interposer substrate and a grounding conductive via, and the antenna substrate is electrically connected to the chip through the grounding layer of the interposer substrate and the grounding conductive via.

15. The semiconductor package of claim 9, wherein the chip includes an active surface facing the spacer substrate.

16. The semiconductor package of claim 9, wherein the antenna layer is exposed from the package body.

17. The semiconductor package of claim 9, wherein the antenna layer of the antenna substrate includes a feeding portion and a grounding portion, and the semiconductor package includes:
a feeding wire connecting the feeding portion of the antenna layer and the package substrate; and
a grounding wire connecting the grounding portion of the antenna layer and the package substrate.

18. The semiconductor package of claim 9, further comprising:
   a passive component disposed on the package substrate;
   wherein the antenna substrate at least partially extends over the passive component.

19. A method of making a semiconductor package, comprising:
   providing a package substrate, wherein the package substrate includes an upper surface;
   disposing a chip on the upper surface of the package substrate;
   providing an antenna substrate, wherein the antenna substrate is verified to be a working antenna substrate; and wherein the antenna substrate includes
      a core layer including an upper surface, a lower surface, a lateral surface extending between the upper surface and the lower surface of the core layer, and a conductive via;
      a grounding layer formed on the lower surface of the core layer; and
      an antenna layer formed on the upper surface of the core layer and electrically connected to the grounding layer through the conductive via;
   disposing the antenna substrate on the chip, a spacing between the antenna substrate and the chip being less than 500 micrometers, the antenna substrate covering the chip; and
   forming a package body encapsulating and in contact with the chip, a portion of the upper surface of the substrate, and the entire lateral surface of the core layer of the antenna substrate.

20. The method of claim 19, further comprising disposing a spacer substrate on the chip prior to disposing the antenna substrate on the chip.

* * * * *